(12) United States Patent
Chen et al.

(10) Patent No.: US 10,535,781 B2
(45) Date of Patent: Jan. 14, 2020

(54) THIN FILM TRANSISTOR AND FABRICATING METHOD THEREOF, AND ARRAY SUBSTRATE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Lin Chen, Beijing (CN); Haijiao Qian, Beijing (CN); Chengshao Yang, Beijing (CN); Mengyu Luan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/988,805

(22) Filed: May 24, 2018

(65) Prior Publication Data
US 2019/0131461 A1 May 2, 2019

(30) Foreign Application Priority Data
Oct. 27, 2017 (CN) .......................... 2017 1 1027663

(51) Int. Cl.
*H01L 29/786* (2006.01)
*H01L 29/417* (2006.01)
*H01L 29/66* (2006.01)

(52) U.S. Cl.
CPC .. *H01L 29/78696* (2013.01); *H01L 29/41733* (2013.01); *H01L 29/66742* (2013.01); *H01L 29/78618* (2013.01)

(58) Field of Classification Search
CPC ......... H01L 29/78696; H01L 29/41733; H01L 29/66742; H01L 29/78618
USPC ............................................................ 257/66
See application file for complete search history.

(56) References Cited

U.S. PATENT DOCUMENTS

2006/0027838 A1* 2/2006 Koo ..................... H01L 27/3262
257/257
2018/0374874 A1* 12/2018 Cao ......................... H01L 21/84

* cited by examiner

*Primary Examiner* — Tong-Ho Kim
(74) *Attorney, Agent, or Firm* — Nath, Goldberg & Meyer; Joshua B. Goldberg

(57) ABSTRACT

The disclosure provides a thin film transistor and a fabricating method thereof, and an array substrate. The thin film transistor includes a gate, a first active layer, a second active layer, a first source, a first drain, a second source and a second drain which are provided above a base substrate. The first active layer is located at a side of the gate facing the base substrate, and the second active layer is located at a side of the gate facing away from the first active layer. The first source and the first drain are located at a side of the first active layer facing away from the gate and are connected with the first active layer. The second source and the second drain are located at a side of the second active layer facing away from the gate and are connected with the second active layer.

10 Claims, 14 Drawing Sheets

THIN FILM TRANSISTOR AND FABRICATING METHOD THEREOF, AND ARRAY SUBSTRATE

CROSS-REFERENCE TO RELATED APPLICATION

The present application claims priority to Chinese Patent Application NO. 201711027663.2, filed in China on Oct. 27, 2017, the disclosure of which is hereby incorporated by reference in its entirety.

TECHNICAL FIELD

The present disclosure relates to the field of display technology, in particular, to a thin film transistor and a fabricating method thereof, and an array substrate.

BACKGROUND

In a display device in which image display is driven by current, whether current outputted from a drain of a Thin Film Transistor (TFT) in the drive circuit is stable or not may have a direct impact on the display effect of the display device.

Stable output current may be obtained by utilizing the current characteristics of a TFT in the saturation region. In this case, the current outputted by the TFT is related to the gate-source voltage and the width-to-length ratio of channel of the TFT, regardless of the magnitude of the source-drain voltage (the output resistance of the TFT is infinite). However, when the drain voltage of the TFT reaches up to a certain extent, a pinch-off region occurs in the channel, i.e., the length of the channel may be reduced, and the width-to-length ratio of channel may be varied. In this case, the change in the width-to-length ratio of the channel may cause a larger fluctuation in the current outputted by the TFT, thereby affecting the display effect of the display device.

Furthermore, the TFT in the related art has a larger dimension, which may lead to a smaller pixel aperture ratio when the TFT is applied in the display device. According to an industry standard, the luminance of a display should reach a certain level. A smaller aperture ratio implies that an aperture region per unit area should emit light with much higher luminance to compensate for the smaller aperture ratio. However, increasing the luminance of the aperture region per unit area would greatly decrease the lifetime of a luminescent material.

SUMMARY

The present disclosure provides a thin film transistor and a fabricating method thereof, and an array substrate.

According to an aspect of the present disclosure, provided is a thin film transistor including a gate, a first active layer, a second active layer, a first source, a first drain, a second source and a second drain which are provided above a base substrate. The first active layer is located at a side of the gate facing the base substrate, and the second active layer is located at a side of the gate facing away from the first active layer. The first source and the first drain are located at a side of the first active layer facing away from the gate and are connected with the first active layer. The second source and the second drain are located at a side of the second active layer facing away from the gate and are connected with the second active layer. The first drain and the second drain each have a ring-like shape, the first drain surrounds the first source, and the second drain surrounds the second source. The first source is electrically connected with the second source, and the first drain is electrically connected with the second drain.

According to an embodiment of the present disclosure, the thin film transistor further includes a first conductive pattern and a second conductive pattern, and a first insulation layer and a second insulation layer. The first conductive pattern is located at a side of the first source facing away from the first active layer, and extends beyond a region surrounded by the first drain. The first insulation layer is formed between the first conductive pattern and the first active layer, the first insulation layer is formed with a first via therein, and the first source is connected to the first conductive pattern through the first via. The second conductive pattern is located at a side of the second source facing away from the second active layer, and extends beyond a region surrounded by the second drain. The second insulation layer is formed between the second conductive pattern and the second active layer, the second insulation layer is provided with a second via therein, and the second source is connected to the second conductive pattern through the second via. A portion of the first conductive pattern located outside of the region surrounded by the first drain is connected with a portion of the second conductive pattern located outside of the region surrounded by the second drain.

According to an embodiment of the present disclosure, the thin film transistor further includes a third conductive pattern and a fourth conductive pattern. The third conductive pattern is connected with the first drain, the fourth conductive pattern is connected with the second drain, and the third conductive pattern is connected with the fourth conductive pattern.

According to an embodiment of the present disclosure, the thin film transistor further includes a fifth conductive pattern. The fifth conductive pattern is provided in a same layer as the first conductive pattern, and the third conductive pattern is lapped over the fifth conductive pattern.

According to an embodiment of the present disclosure, the thin film transistor further includes a sixth conductive pattern. The sixth conductive pattern is provided in a same layer as the second conductive pattern, and the sixth conductive pattern is lapped over the fourth conductive pattern.

According to an embodiment of the present disclosure, the first drain and the second drain each have a circular ring shape, and the first source and the second source each have a circular shape.

According to another aspect of the present disclosure, provided is an array substrate which includes the above thin film transistor.

According to still another aspect of the present disclosure, provided is a fabricating method of a thin film transistor which includes: forming a first source and a first drain above a base substrate such that the first drain has a ring-like shape, and the first drain surrounds the first source; forming a first active layer at a side of the first source and the first drain facing away from the base substrate such that the first source and the first drain are connected with the first active layer; forming a gate at a side of the first active layer facing away from the base substrate; forming a second active layer at a side of the gate facing away from the base substrate; forming a second source and a second drain at a side of the second active layer facing away from the base substrate such that the second drain has a ring-like shape, the second drain surrounds the second source, and the second source and the second drain are connected with the second active layer. The second source is electrically connected with the first source, and the second drain is electrically connected with the first drain.

According to an embodiment of the present disclosure, prior to the step of forming the first source and the first drain above the base substrate, the method further includes: forming a first conductive pattern on the base substrate such that the first conductive pattern extends beyond a region surrounded by the first drain which will be formed later; forming a first insulation layer at a side of the first conductive pattern facing away from the base substrate, and forming a first via in the first insulation layer such that the first source which will be formed later is connected with the first conductive pattern through the first via. Furthermore, after the step of forming the second source and the second drain at the side of the second active layer facing away from the base substrate, the method further includes: forming a second insulation layer at a side of of the second source and the second drain facing away from the base substrate, and forming a second via in the second insulation layer; forming a second conductive pattern at a side of the second insulation layer facing away from the base substrate such that the second conductive pattern is connected with the second source through the second via, and the second conductive pattern extends beyond a region surrounded by the second drain. A portion of the second conductive pattern located outside of the region surrounded by the second drain is connected with a portion of the first conductive pattern located outside of the region surrounded by the first drain. Furthermore, a third conductive pattern connected with the first drain is formed at a same time when the first source and the first drain are formed above the base substrate, and a fourth conductive pattern connected with the second drain is formed at a same time when the second source and the second drain are formed at the side of the second active layer facing away from the base substrate. The fourth conductive pattern is connected with the third conductive pattern.

According to an embodiment of the present disclosure, a fifth conductive pattern is further formed so as to be provided in a same layer as the first conductive pattern, at a same time when the first conductive pattern is formed on the base substrate, and the third conductive pattern which is formed later is lapped over the fifth conductive pattern. Furthermore, a sixth conductive pattern is further formed so as to be provided in a same layer as the second conductive pattern, at a same time when the second conductive pattern is formed at the side of the second insulation layer facing away from the base substrate, and the sixth conductive pattern is lapped over the fourth conductive pattern.

DETAILED DESCRIPTION

The embodiments provided by the present disclosure will be described in detail below in conjunction with the drawings in order that a person skilled in the art can understand the technical solutions of the present disclosure better.

Figure 1:
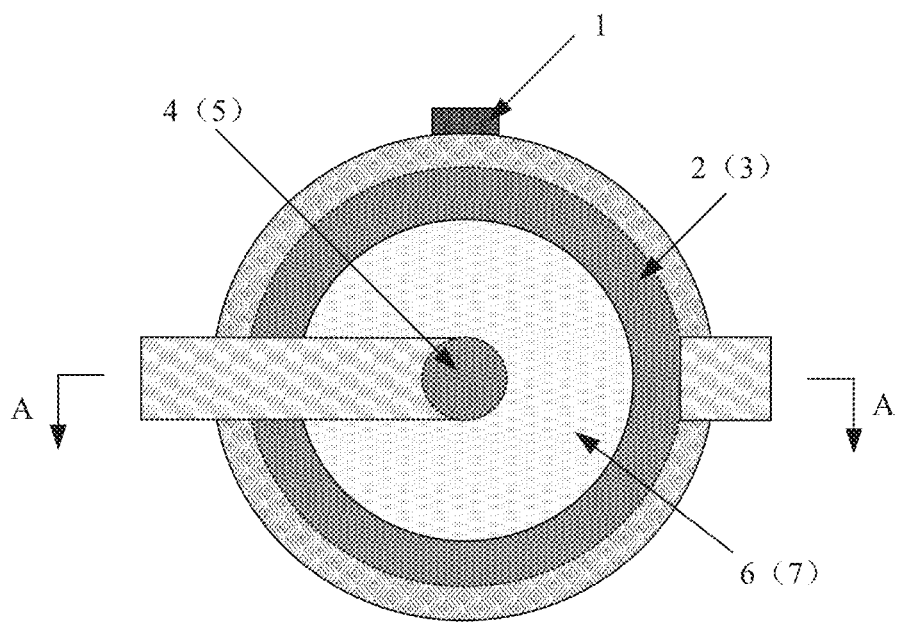
FIG. 1 is a top view of a thin film transistor according to an embodiment of the present disclosure.
Figure 2:
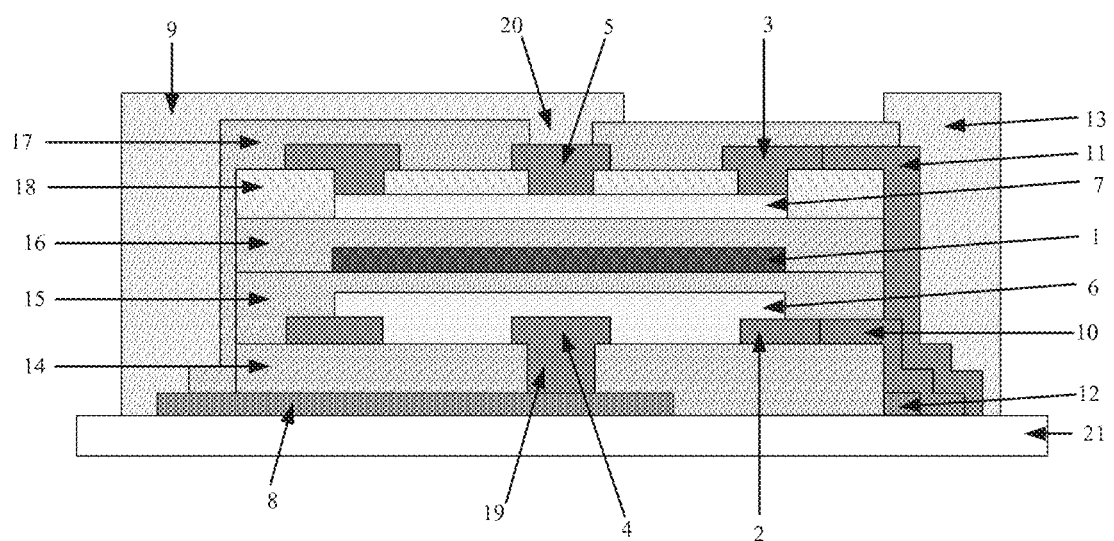
FIG. 2 is a cross-sectional view of the thin film transistor taken along with a line A-A in FIG. 1.

FIG. 1 is a top view of a thin film transistor according to an embodiment of the present disclosure, and FIG. 2 is a cross-sectional view of the thin film transistor taken along with a line A-A in FIG. 1.

Referring to FIGS. 1 and 2, the thin film transistor according to an embodiment of the present disclosure includes a gate 1, a first active layer 6, a second active layer 7, a first source 4, a first drain 2, a second source 5 and a second drain 3 which are provided above a base substrate 21. The first active layer 6 is located at a side of the gate 1 facing the base substrate 21, and the second active layer 7 is located at a side of the gate 1 facing away from the first active layer 6. The first source 4 and the first drain 2 are located at a side of the first active layer 6 facing away from the gate 1 and are connected with the first active layer 6. The second source 5 and the second drain 3 are located at a side of the second active layer 7 facing away from the gate 1 and are connected with the second active layer 7.

As shown in FIG. 1, in the top view, the first drain 2 and the second drain 3 each have a ring-like shape, the first drain 2 surrounds the first source 4, and the second drain 3 surrounds the second source 5. The first source 4 is electrically connected with the second source 5, and the first drain 2 is electrically connected with the second drain 3.

According to an embodiment of the present disclosure, a first gate insulation layer 15 is provided between the gate 1 and the first active layer 6, and a second gate insulation layer 16 is provided between the gate 1 and the second active layer 7. Additionally, an interlayer insulation layer 18 is provided on the second active layer 7 and between the second source 5 and the second drain 3.

According to an embodiment of the present disclosure, the thin film transistor is designed with double active layers. In a case that a channel length of a thin film transistor is not changed, a channel width of the thin film transistor will be doubled if the lengths of the channels in the first active layer 6 and the second active layer 7 are equal; in a case that a gate-source voltage is not changed, a magnitude of a saturated current of the thin film transistor will be doubled. Furthermore, in a case that a maximum drive current required by a light-emitting element is constant, the widths of the channels in the first active layer 6 and the second active layer 7 may be reduced by half, reducing an area occupied by the whole thin film transistor. The reduction of the area of the thin film transistor may improve the pixel aperture ratio effectively, which decreases the luminous amount of the light-emitting material per unit area as required, thus the reduction of the lifetime of the light-emitting material may be retarded and the device lifetime may be increased. According to an embodiment of the present disclosure, the orthographic projections of the first drain 2 and the second drain 3 on the base substrate 21 may overlapped completely, and the orthographic projections of the first source 4 and the second source 5 on the base substrate 21 may overlapped completely so as to facilitate miniaturization of the thin film transistor.

According to an embodiment of the present disclosure, the first drain 2 and the second drain 3 are designed to have a ring-like shape, and the first drain 2 is designed to surround the first source 4, and the second drain 3 is designed to surround the second source 5. In this case, the width-to-length ratio of the channel region for each of the first active layer 6 and the second active layer 7 is a logarithmic function of the channel dimension. Consequently, even if the effective length of the channel is changed, the change in the width-to-length ratio of the channel region is retarded. Compared with the related art, the technical solution according to the present disclosure may reduce the fluctuation in the output current of the thin film transistor and improve the stability of the output current when the thin film transistor is in the saturation region, thereby reducing the impact of the change in the drive current on the display effect of the display device.

From the above description it can be seen that, according to the technical solution of the present disclosure, it is possible to improve the stability of the output current when the thin film transistor is in the saturation region while reducing the dimension of the thin film transistor, thereby improving the lifetime and the display effect of the display device.

According to an embodiment of the present disclosure, the first drain 2 and the second drain 3 each may have a circular ring shape, and the first source 4 and the second source 5 each may have a circular shape. The orthographic projections of the circle centers of the first drain 2 and the first source 4 on the base substrate 21 may be overlapped, and the orthographic projections of the circle centers of the second drain 3 and the second source 5 on the base substrate 21 may be overlapped.

Figure 3:
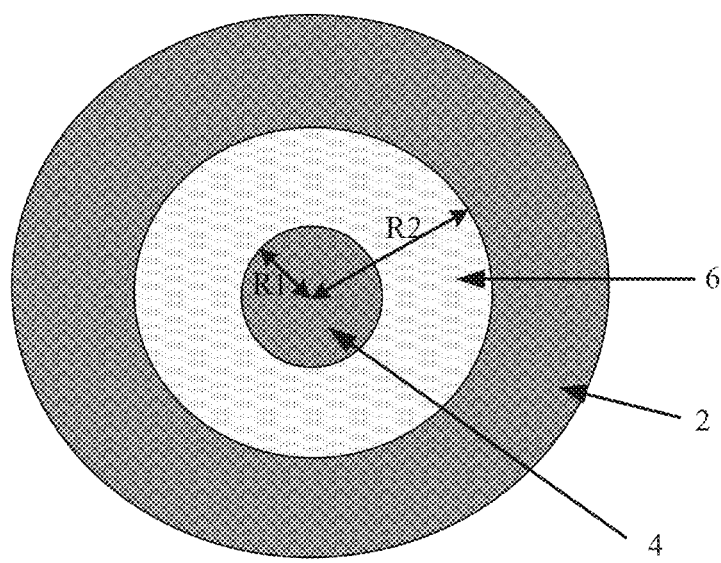
FIG. 3 is a top view of a first source, a first drain and a first active layer in a thin film transistor according to an embodiment of the present disclosure.

FIG. 3 is a top view of the first source, the first drain and the first active layer in a thin film transistor according to an embodiment of the present disclosure.

As shown in FIG. 3, the first source 4, the first drain 2 and the first active layer 6 forms a Corbino structure. In this case, a Corbino effect occurs in the the channel portion in the first active layer 6 (a portion of the first active layer 6 located between the first source 4 and the first drain 2).

Figure 4A:
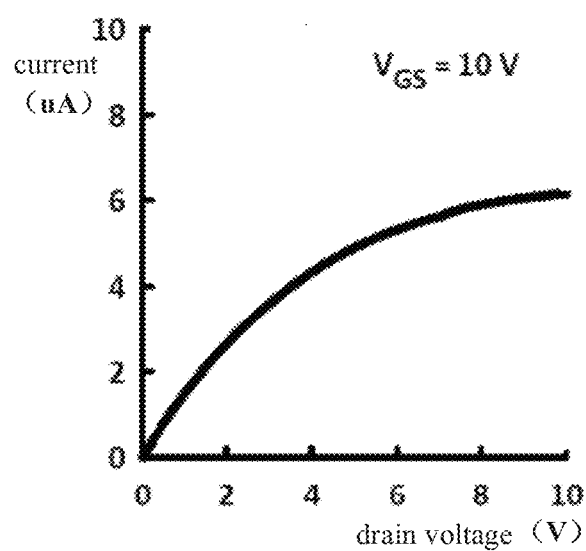
FIG. 4a is a graph illustrating output characteristics of a thin film transistor in the related art.
Figure 4B:
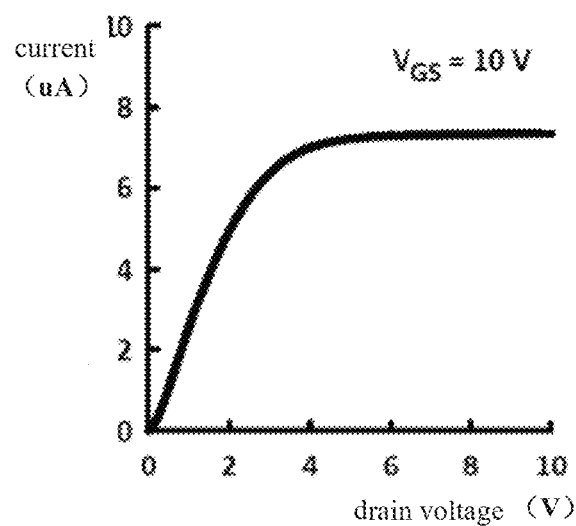
FIG. 4b is a graph illustrating output characteristics of a thin film transistor having a Corbino structure.

FIG. 4a is a graph illustrating output characteristics of a thin film transistor in the related art, and FIG. 4b is a graph illustrating output characteristics of the thin film transistor having a Corbino structure.

As shown in FIGS. 4a and 4b, the output current $I_{DS}$ of the thin film transistor in the saturation region may be calculated by the following equation:

$$I_{DS} = \frac{1}{2} * K * \frac{W}{L}(V_{GS} - V_{th})$$

wherein, K is a constant related to an active layer, W is a channel width of the active layer, L is a channel length of the active layer, $V_{GS}$ is a gate-source voltage, and $V_{th}$ is a threshold voltage of the thin film transistor.

A drive current outputted by the thin film transistor in the related art has a linear relation with the width-to-length ratio of the channel (i.e., $\frac{W}{L}$), and thus the change in the channel length may lead to a large fluctuation in the drain current.

A channel width W of the thin film transistor with the Corbino structure is a function related to the channel length L. As shown in FIG. 3, a radius of the first source 4 is R1, an inner radius of the first drain 2 is R2, and the channel width W of the thin film transistor may be calculated by the following equation:

$$W = \frac{2\pi}{\ln(R_2/R_1)} * L$$

Thereby obtaining the width-to-length ratio of the channel of the thin film transistor:

$$\frac{W}{L} = \frac{2\pi}{\ln(R_2/R_1)}$$

Therefore, when a pinch-off region occurs in the channel, the channel width W will be changed as the channel length L is changed, thus retarding the changing of the width-to-length ratio of the channel and reducing the fluctuation in the drive current.

Furthermore, the thin film transistor according to an embodiment of the present disclosure has very stable electrical characteristics even when it is in a curved state. As for the structure of the thin film transistor which is constructed by the concentric-ring-shaped electrodes, the first drain 2 as the outer ring needs to consume more electrons than the first source 4 as the inner ring. Thus, under the same drain bias condition, the thin film transistor which has the Corbino structure and is in the saturation state may has less channel charges as compared with the thin film transistor in the related art. Consequently, electrons are rarely captured due to the natural stress effect, resulting in a smaller change in the threshold voltage of the thin film transistor having the Corbino structure. On the other hand, mechanical bending strain may cause atomic distance in a semiconductor to increase, which effectively decreases splitting of energy levels of the bonding orbitals and the antibonding orbitals among atoms. This is because that, if more electrons are excited to antibonding orbitals of the semiconductor, Fermi function value will be changed, while improvement of the electrical conductivity of the channel will result in a negative drift of the threshold voltage in regard of the transfer characteristics of the thin film transistor, which causes the thin film transistor having the Corbino structure not to be limited by the bending direction, and thus presents a excellent stability under the mechanical bending strain.

Based on the same principle as mentioned above, in the case that the second drain 3 has a circular ring shape and the second source 5 has a circular shape, the stability of the output current of the thin film transistor and the stability of the electrical characteristics thereof in a bending state may also be ensured.

It should be noted that, the configuration in which the first drain 2 and the second drain 3 each have a circular ring shape and the first source 4 and the second source 5 each have a circular shape is only an embodiment of the present disclosure; according to this embodiment, the stability of the electrical characteristics of the thin film transistor in a bending state may be improved while the stability of the output current of the thin film transistor is ensured. However, the technical solution of the present disclosure is not limited to this. According to other embodiments of the present disclosure, it is also possible that the first drain 2 and the second drain 3 each may have an elliptic ring shape, and the first source 4 and the second source 5 each may have a shape of circle, circular ring, ellipse or elliptic ring. Furthermore, the centers of the first drain 2 and the first source 4 may be overlapped or may be not overlapped, and the centers of the second drain 3 and the second source 5 may be overlapped or may be not overlapped. Furthermore, the first drain 2 and the second drain 3 each may have a circular ring shape, and the first source 4 and the second source 5 each may have a shape of circular ring, ellipse or elliptic ring. There are many other examples which will not be listed here.

A person skilled in the art should be understand that, the stability of the output current of the thin film transistor will be effectively improved as long as the first drain 2 and the second drain 3 each have a ring-like shape, the first drain 2 surrounds the first source 4 and the second drain surrounds the second source 5.

Referring to FIGS. 1 and 2 again, the thin film transistor according to an embodiment of the present disclosure may further include a first conductive pattern 8 and a second conductive pattern 9. The first conductive pattern 8 is located at a side of the first source 4 facing away from the first active layer 6, and the first conductive pattern 8 extends beyond a region surrounded by the first drain 2. A first insulation layer 14 is formed between the first conductive pattern 8 and the first active layer 6, and a first via 19 is formed in the first insulation 14. The first active layer 6 and the first conductive pattern 8 are connected through the first via 19. the second conductive pattern 9 is located at a side of the second source 5 facing away from the second active layer 7, and the second conductive pattern 9 extends beyond a region surrounded by the second drain 3. A second insulation layer 17 is formed between the second conductive pattern 9 and the second active layer 7, a second via 20 is formed in the second insulation layer 17, and the second active layer 7 and the second conductive pattern 9 are connected through the second via 20. An interlayer insulation layer 18 is formed on the second active layer 7, and the second source 5 and the second drain 3 passes through the interlayer insulation layer 18 to be connected with the second active layer 7. A portion of the first conductive pattern 8 located outside of the region surrounded by the first drain 2 is connected with a portion of the second conductive pattern 9 located outside of the region surrounded by the second drain 3.

It should be noted that, the configuration as described in the above embodiment (i.e., the configuration in which the first conductive pattern 8 is connected with the first source 4, the second conductive pattern 9 is connected with the second source 5, a lapping connection is formed between the first conductive pattern 8 and the second conductive pattern 9, and thus the first source 4 is electrically connected with the second source 5) is only an implementation of the embodiment of the present disclosure. A person skilled in the art should recognize that the first source 4 and the second source 5 may be electrically connected with each other in various other ways which should also be considered as belonging to the protective scope of the present disclosure.

The thin film transistor according to an embodiment of the present disclosure may further include a third conductive pattern 10 and a fourth conductive pattern 11. The third conductive pattern 10 is connected with the first drain 2, the fourth conductive pattern 11 is connected with the second drain 3, and the third conductive pattern 10 is connected with the fourth conductive pattern 11.

The third conductive pattern 10 and the first drain 2 may be fabricated simultaneously by a single patterning process, and the fourth conductive pattern 11 and the second drain 3 may be fabricated simultaneously by a single patterning process.

It should be noted that, the configuration as described in the above embodiment (i.e., the configuration in which the third conductive pattern 10 is connected with the first drain 2, the fourth conductive pattern 11 is connected with the second drain 3, a connection is formed between the third conductive pattern 10 and the fourth conductive pattern 11, and thus the first drain 2 is electrically connected with the second drain 3) is only an implementation of the embodiment of the present disclosure. A person skilled in the art should recognize that the first drain 2 and the second drain 3 may be electrically connected with each other in various other ways which should also be considered as belonging to the protective scope of the present disclosure.

The thin film transistor according to an embodiment of the present disclosure may also include a fifth conductive pattern 12. The fifth conductive pattern 12 is provided in a same layer as the first conductive pattern 8, and the third conductive pattern 10 is lapped over the fifth conductive pattern 12. In the practical producing process, it has been found that, the third conductive pattern 10 may extend to an upper surface of the base substrate 21 along an upper surface and a side face of the first insulation layer 14 during formation of the third conductive pattern 10. Since the first insulation layer 14 has a relatively large thickness, the third insulation layer 10 is apt to break, and it is difficult to make the portion of the fourth conductive pattern 11 located at the side face of the first insulation layer 14 lapped over the third conductive pattern 10. To solve this technical problem, the fifth conductive pattern 12 is provided on the base substrate 21 such that a step is formed by the fifth conductive pattern 12 and the first insulation layer 14, which may effectively prevent the third conductive pattern 10 from breaking, and facilitate lapping of the portion of the fourth conductive pattern 11 located at the side face of the first insulation layer 14 over the third conductive pattern 10. Meanwhile, the fifth conductive pattern 12 may be connected in parallel with the third conductive pattern 10, thereby effectively decreasing the equivalent resistance of the drain portion (which includes the first drain 2, the second drain 3, the third conductive pattern 10, the fourth conductive pattern 11, and the fifth conductive pattern 12) of the resulting thin film transistor. It should be noted that, since the fifth conductive pattern 12 is provided in a same layer as the first conductive pattern 8, the first conductive pattern 8 and the fifth conductive pattern 12 may be fabricated simultaneously by a single patterning process, thus reducing the production time.

The thin film transistor according to an embodiment of the present disclosure may further include a sixth conductive pattern 13. The sixth conductive pattern 13 is provided in a same layer as the second conductive pattern 9, and is lapped over the fourth conductive pattern 11. The sixth conductive pattern 13 may be connected in parallel with the fourth conductive pattern 11, thereby effectively decreasing the equivalent resistance of the drain portion (which includes the first drain 2, the second drain 3, the third conductive pattern 10, the fourth conductive pattern 11, the fifth conductive pattern 12, and the sixth conductive pattern 13) of the resulting thin film transistor. It should be noted that, since the sixth conductive pattern 13 is provided in a same layer as the second conductive pattern 9, the second conductive pattern 9 and the sixth conductive pattern 13 may be fabricated simultaneously by a single patterning process, thus reducing the production time.

It is possible for the thin film transistor according to an embodiment of the present disclosure to improve the stability of the output current of the thin film transistor in the saturation region while reducing the dimension of the thin film transistor, thereby improving the lifetime and the display effect of the display device.

Figure 5:
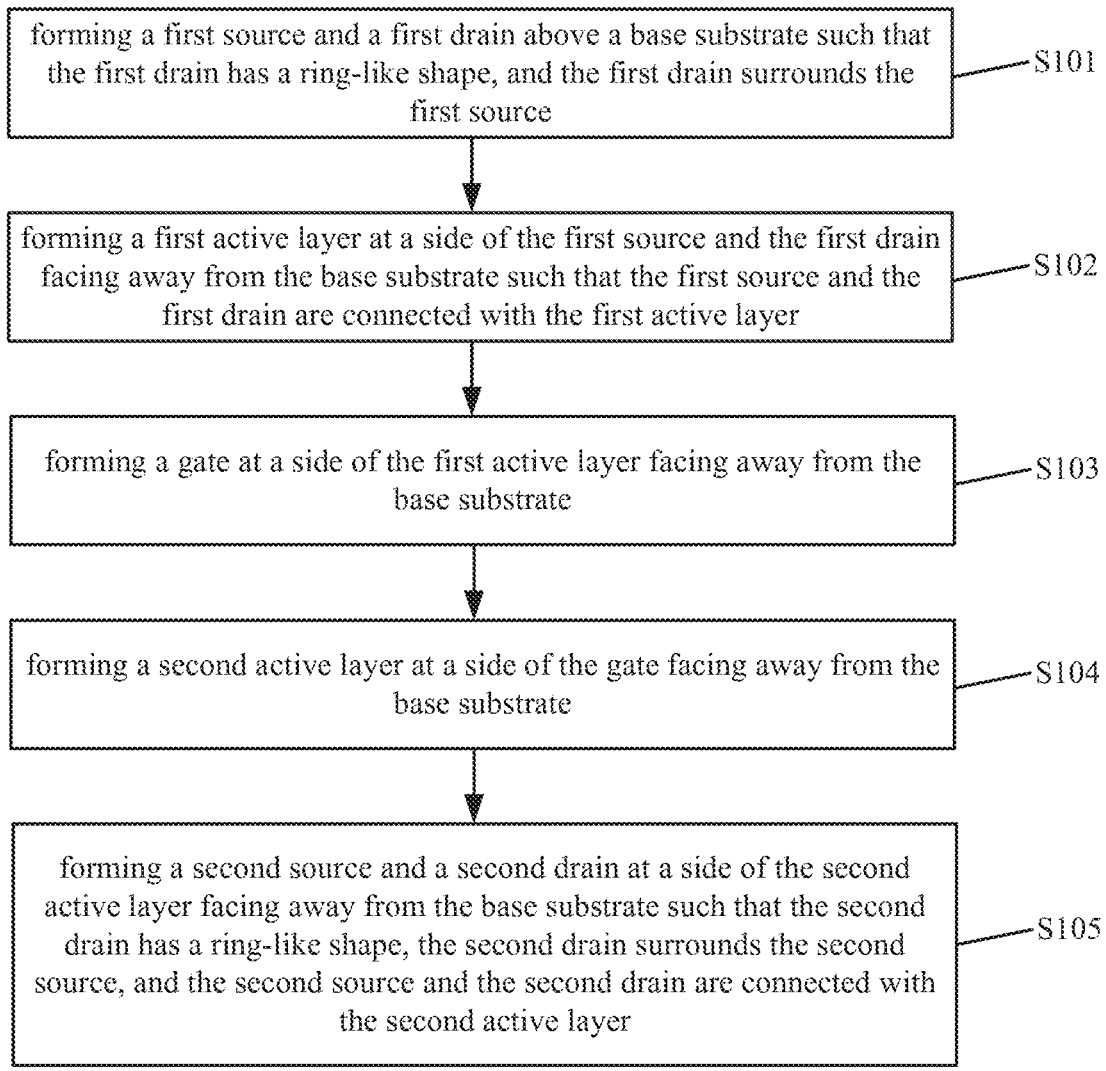
FIG. 5 is a flow chart of a fabricating method of a thin film transistor according to an embodiment of the present disclosure.

FIG. 5 is a flow chart of a fabricating method of a thin film transistor according to an embodiment of the present disclosure.

Referring to FIG. 5, the fabricating method of the thin film transistor according to the embodiment of the present disclosure includes Steps S101 to S105.

At Step S101, a first source and a first drain are formed above a base substrate, the first drain having a ring-like shape, and the first drain surrounding the first source.

At Step S102, a first active layer is formed at a side of the first source and the first drain facing away from the base substrate, the first source and the first drain being connected with the first active layer.

At Step S103, a gate is formed at a side of the first active layer facing away from the base substrate.

At Step S104, a second active layer is formed at a side of the gate facing away from the base substrate.

At Step S105, a second source and a second drain are formed at a side of the second active layer facing away from the base substrate, the second drain having a ring-like shape, the second drain surrounding the second source, and the second source and the second drain being connected with the second active layer.

The second source is electrically connected with the first source, and the second drain is electrically connected with the first drain.

The first source and the second source together constitute a source of the thin film transistor, and the first drain and the second drain together constitute a drain of the thin film transistor.

Figure 6:
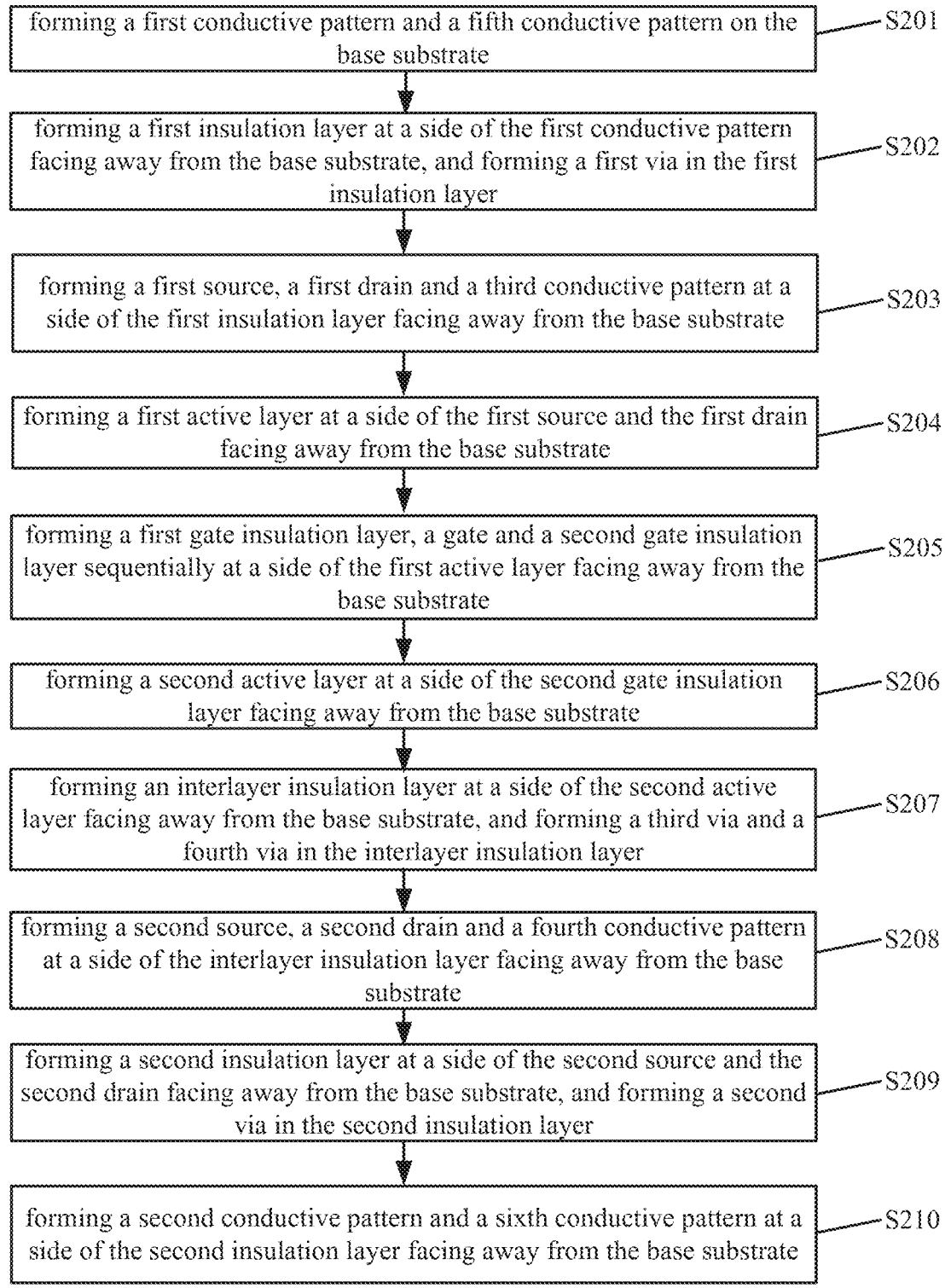
FIG. 6 is a flow chart of a fabricating method of a thin film transistor according to another embodiment of the present disclosure.

FIG. 6 is a flow chart of a fabricating method of a thin film transistor according to an embodiment of the present disclosure, FIGS. 7a to 7j are top views of structures formed in various intermediate steps of the fabricating method of the thin film transistor shown in FIG. 6, and FIGS. 8a to 8j are cross-sectional views of structures formed in various intermediate steps of the fabricating method of the thin film transistor shown in FIG. 6.

Referring to FIG. 6, the fabricating method of the thin film transistor according to the embodiment of the present disclosure includes Steps S201 to S210.

At Step S201, a first conductive pattern and a fifth conductive pattern are formed on a base substrate.

Figure 7A:
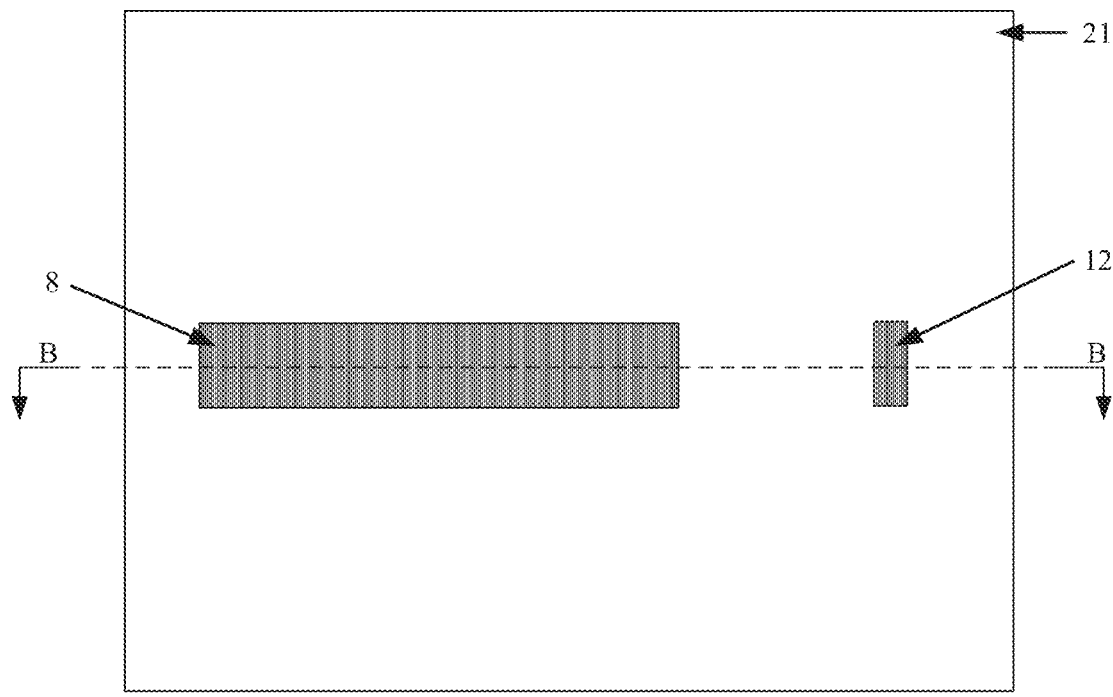
FIGS. 7a to 7j are top views of structures formed in various intermediate steps of the fabricating method of the thin film transistor shown in FIG. 6.
Figure 8A:
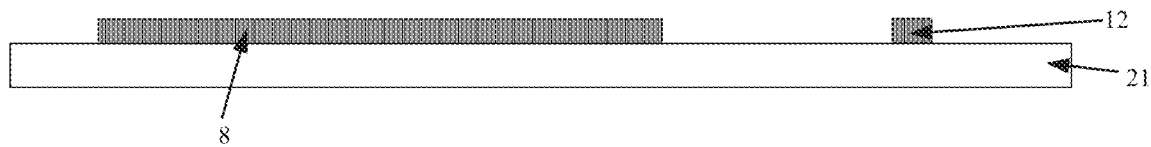
FIGS. 8a to 8j are cross-sectional views of structures formed in various intermediate steps of the fabricating method of the thin film transistor shown in FIG. 6.

Referring to FIGS. 7a and 8a, at Step S201, a first conductive material layer is formed on the base substrate 21, and then the first conductive material layer is processed by a patterning process to obtain the first conductive pattern 8 and the fifth conductive pattern 12. The first conductive pattern 8 extends beyond a region surrounded by the first drain 2 which will be formed later, and the fifth conductive pattern 12 is located outside of an edge of the first insulation layer 14 which will be formed later.

It should be noted that, the patterning process may include processes such as photoresist coating, exposure, developing, film etching, and photoresist stripping. According to an embodiment of the present disclosure, the first conductive material may be a metal material.

At Step S202, a first insulation layer is formed at a side of the first conductive pattern facing away from the base substrate, and a first via is formed in the first insulation layer.

Figure 7B:
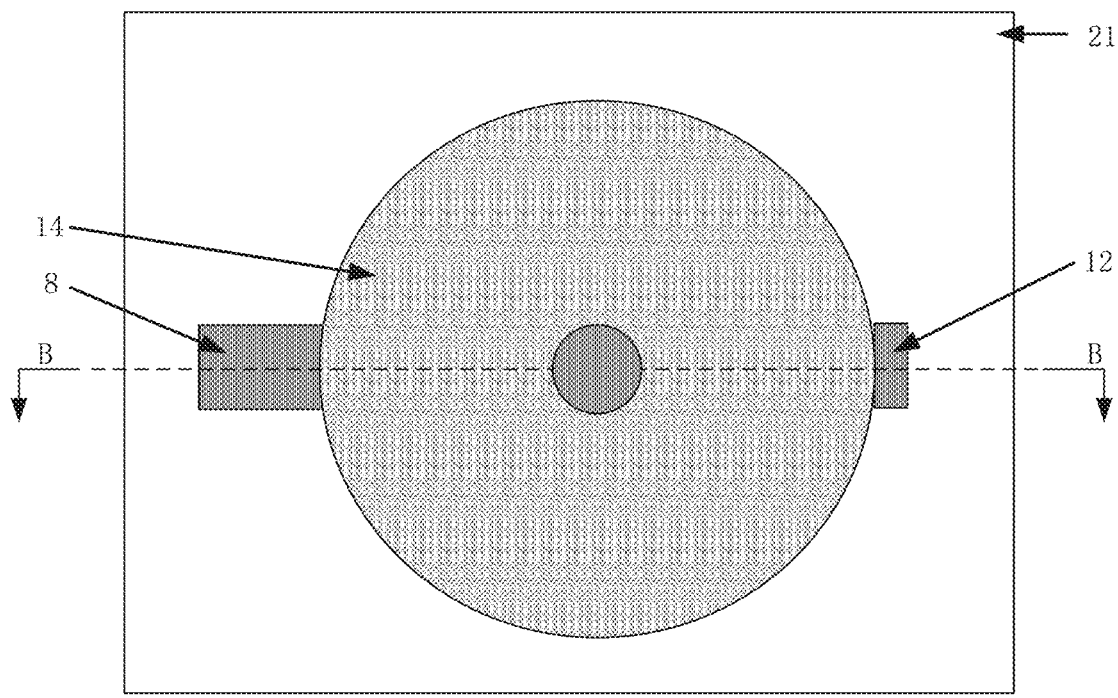
Figure 8B:
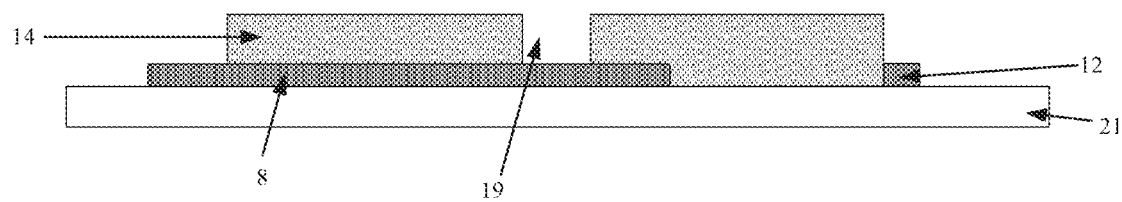

Referring to FIGS. 7b and 8b, at Step S202, a first insulation material layer is formed at a side of the first conductive pattern 8 facing away from the base substrate 21, and then the first insulation material layer is processed by a patterning process to obtain the pattern of the first insulation layer 14. The first via 19 is formed in the first insulation layer 14 to expose a portion of the first conductive pattern 8, and the side face of the first insulation layer 14 is in contact with the side face of the fifth conductive pattern 12.

At Step S203, a first source, a first drain and a third conductive pattern are formed at a side of the first insulation layer facing away from the base substrate.

Figure 7C:
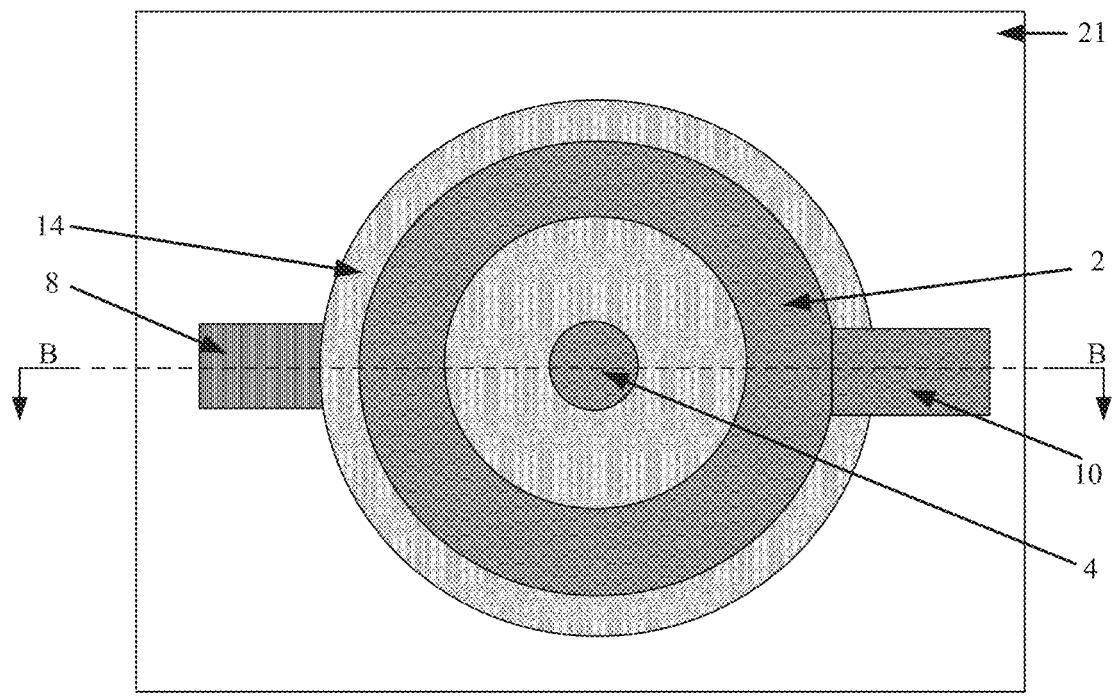
Figure 8C:
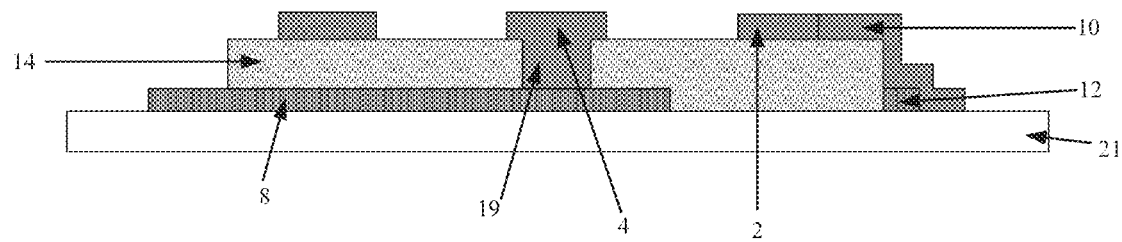

Referring to FIGS. 7c and 8c, at Step S203, a first source-drain material layer is formed at a side of the first insulation layer 14 facing away from the base substrate 21, and then the first source-drain material layer is processed by a patterning process to obtain the first source 4, the first drain 2 and the third conductive pattern 10. The first drain 2 has a ring-like shape and surrounds the first source 4. The first source 4 is filled into the first via 19 in the first insulation layer 14 and is connected with the first conductive pattern 8. The third conductive pattern 10 is connected with the first drain 2. According to an embodiment of the present disclosure, the first source-drain material may be a metal material.

At Step S204, a first active layer is formed at a side of the first source and the first drain facing away from the base substrate.

Figure 7D:
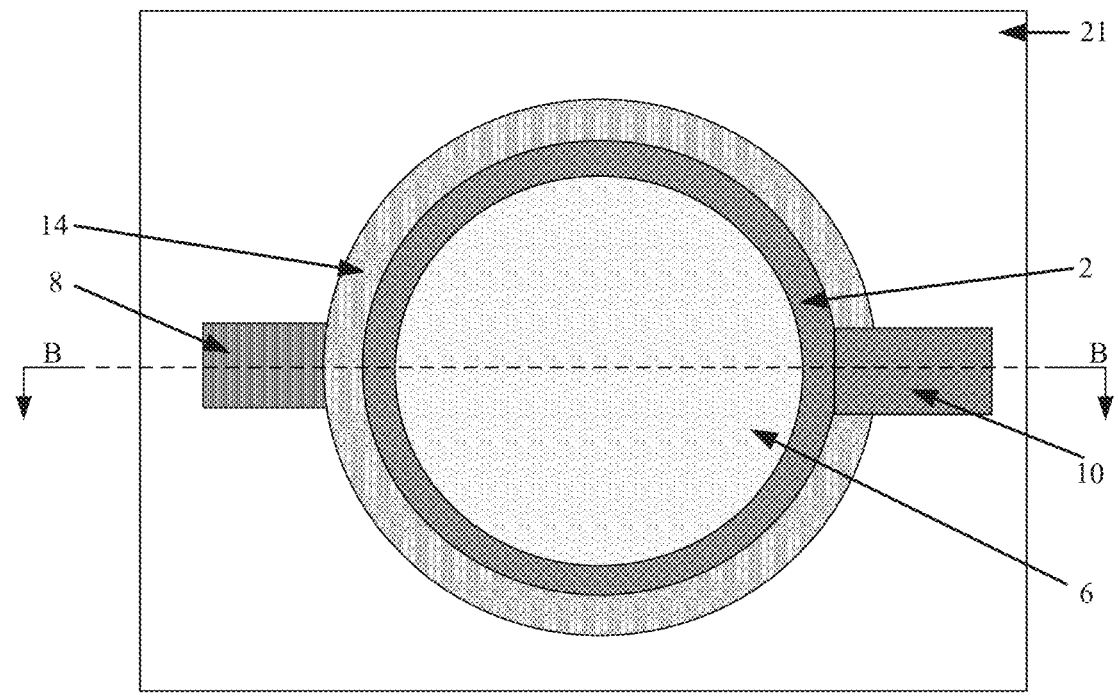
Figure 8D:
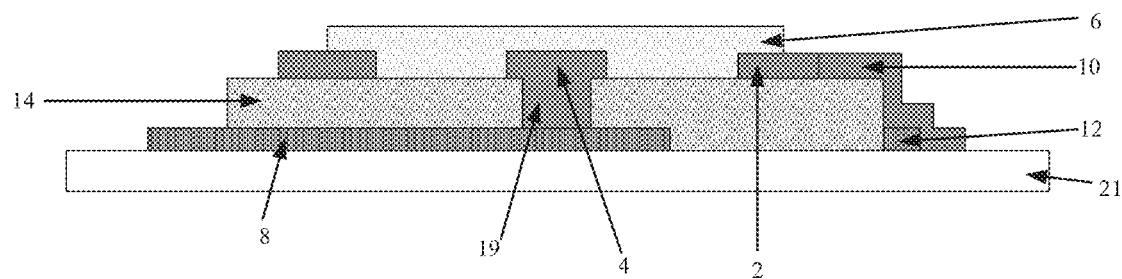

Referring to FIGS. 7d and 8d, at Step S204, a first active material layer is formed at a side of the first source 4 and the first drain 2 facing away from the base substrate 21, and then the first active material layer is processed by a patterning process to obtain the pattern of the first active layer 6.

At Step S205, a first gate insulation layer, a gate and a second gate insulation layer are formed sequentially at a side of the first active layer facing away from the base substrate.

Figure 7E:
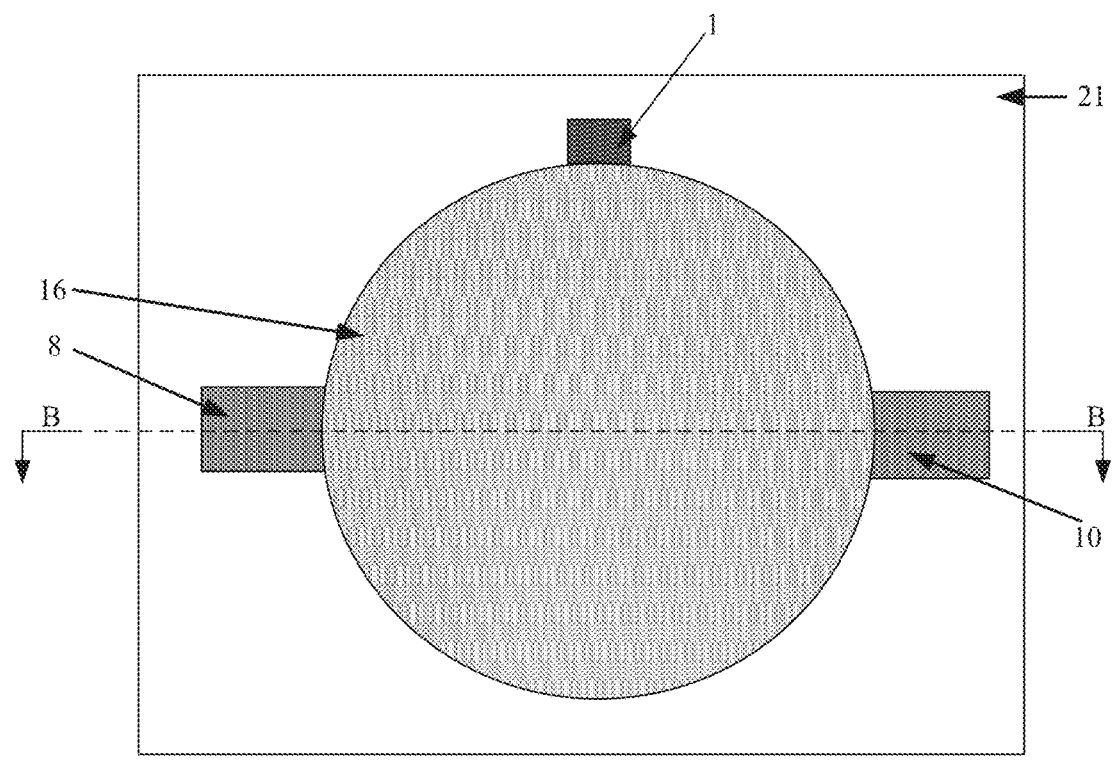
Figure 8E:
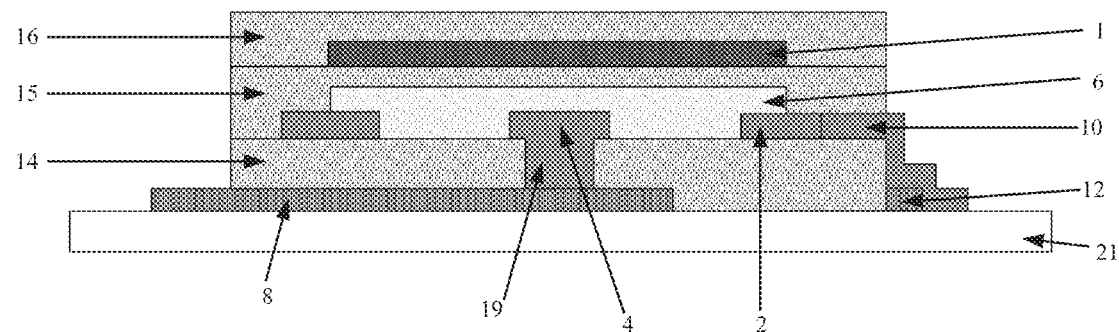

Referring to FIGS. 7e and 8e, at Step S205, by three patterning processes, the patterns of the first gate insulation layer 15, the gate 1 and the second gate insulation layer 16 are individually formed in order in a direction away from the base substrate.

At Step S206, a second active layer is formed at a side of the second gate insulation layer facing away from the base substrate.

Figure 7F:
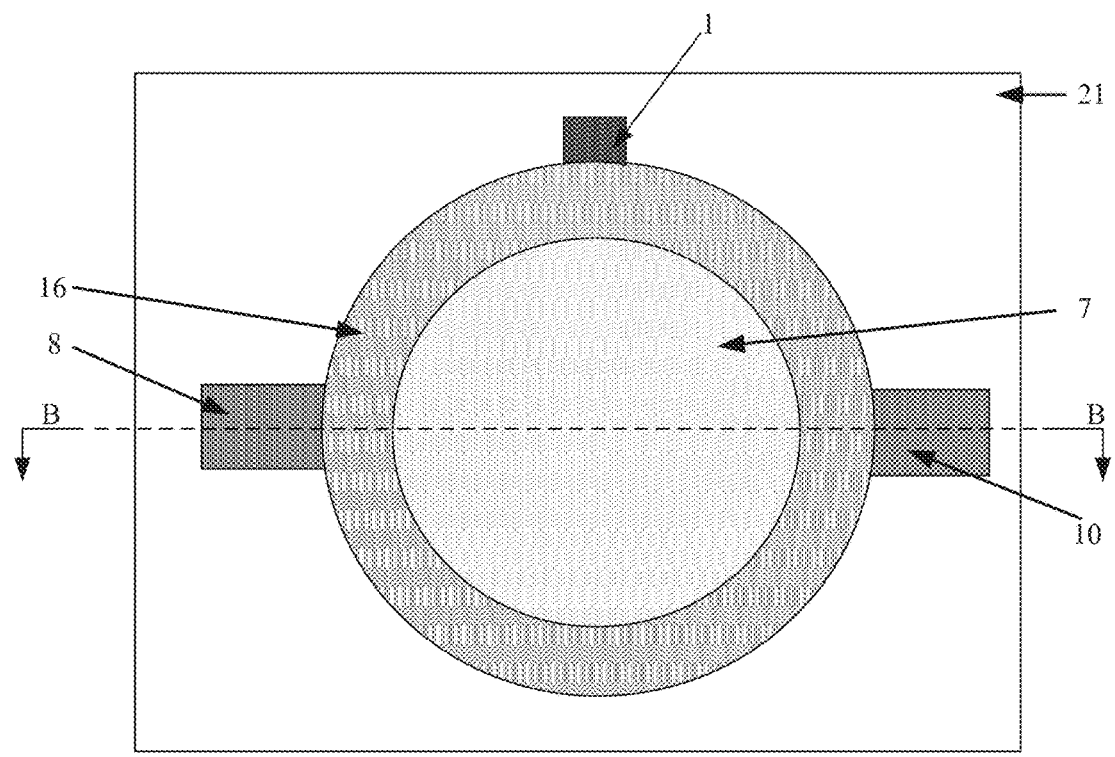
Figure 8F:
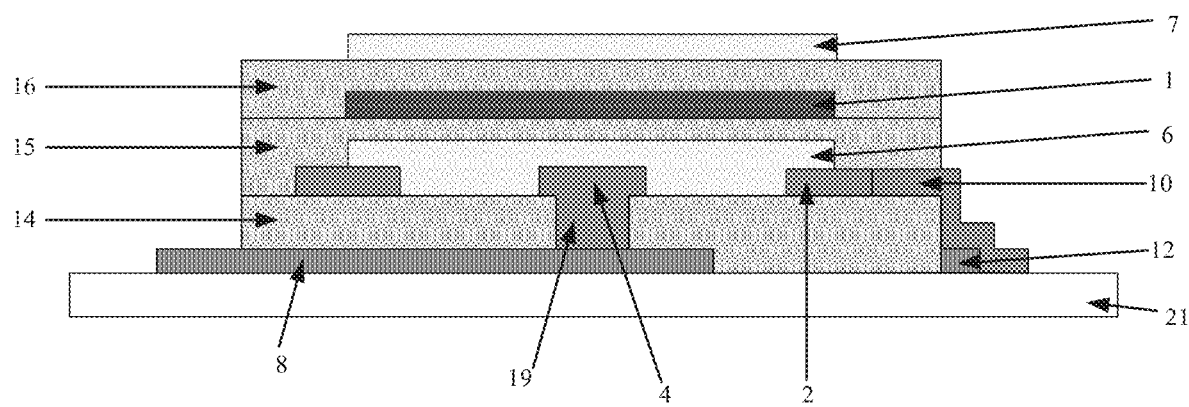

Referring to FIGS. 7f and 8f, at Step S206, a second active material layer is formed at a side of the second gate insulation layer 16 facing away from the base substrate, and then the second active material layer is processed by a patterning process to obtain the pattern of the second active layer 7.

At Step S207, an interlayer insulation layer is formed at a side of the second active layer facing away from the base substrate, and a third via and a fourth via are formed in the insulation layer.

Figure 7G:
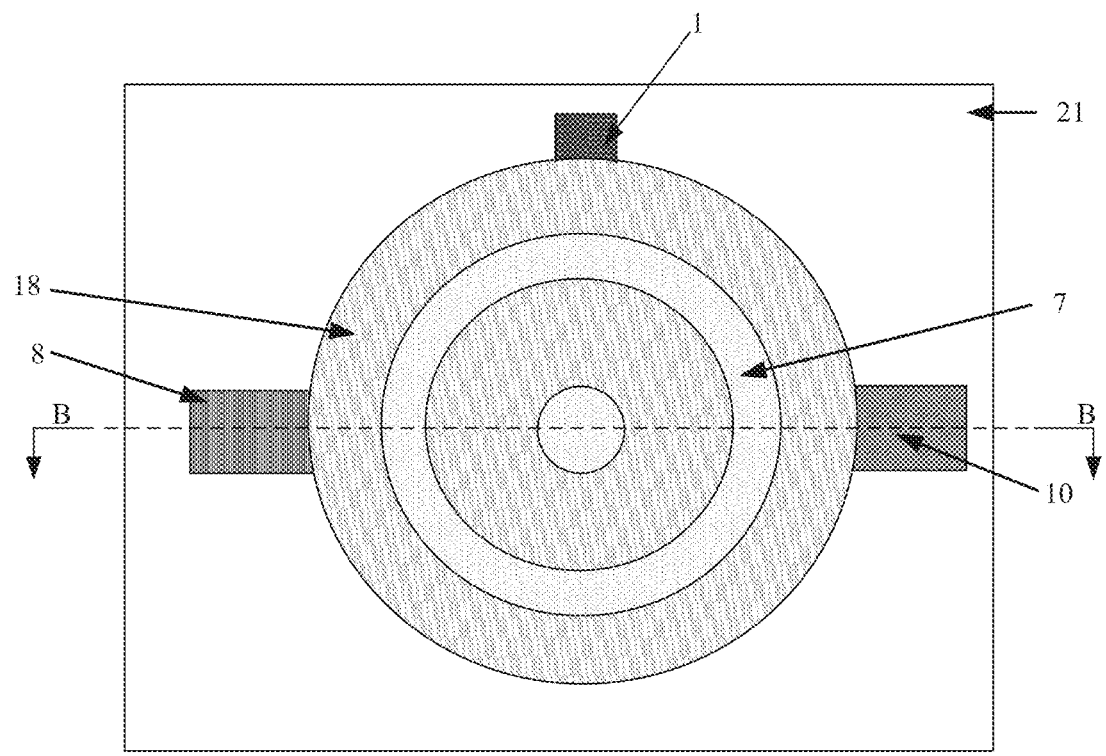
Figure 8G:
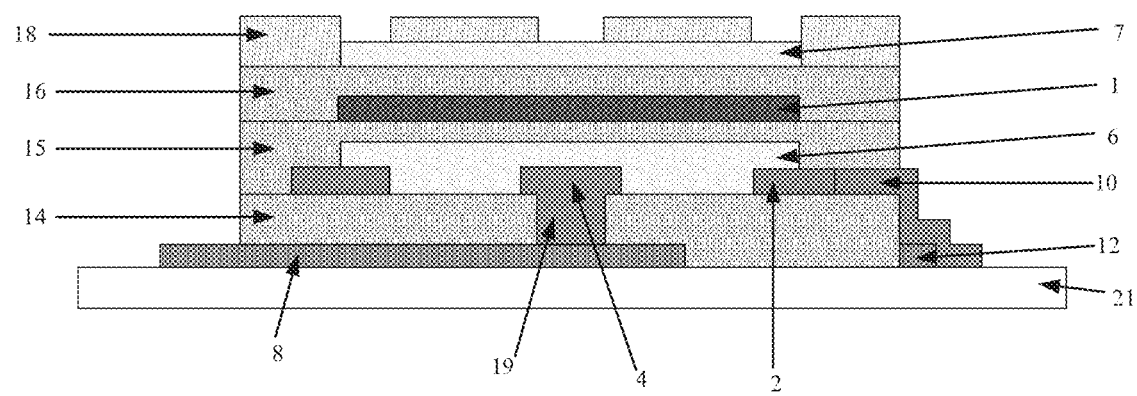

Referring to FIGS. 7g and 8g, at Step S207, an insulation material layer is formed at a side of the second active layer 7 facing away from the base substrate 21, and then the insulation material layer is processed by a patterning process to obtain the pattern of the interlayer insulation layer 18. The third via and the fourth via are formed in the interlayer insulation layer 18.

It should be noted that, according to an embodiment of the present disclosure, Step S207 of forming the interlayer insulation layer 18 may be omitted, that is, Step S208 may be performed immediately after Step S206.

At Step S208, a second source, a second drain and a fourth conductive pattern are formed at a side of the interlayer insulation layer facing away from the base substrate.

Figure 7H:
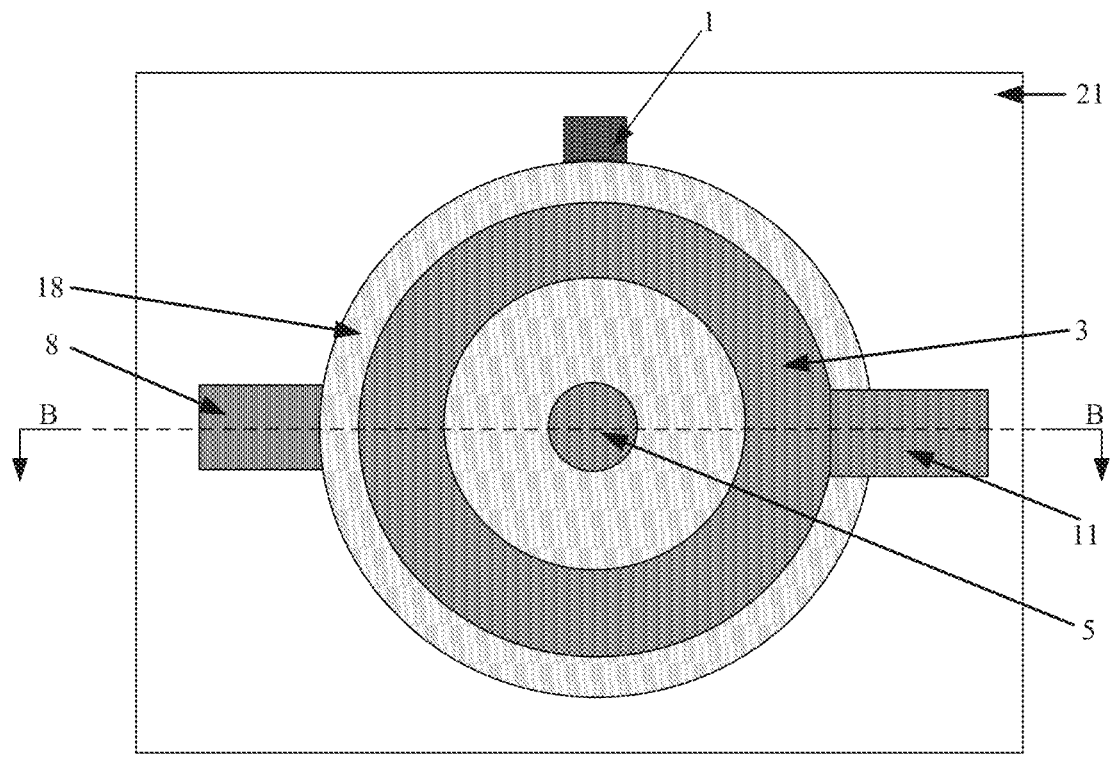
Figure 8H:
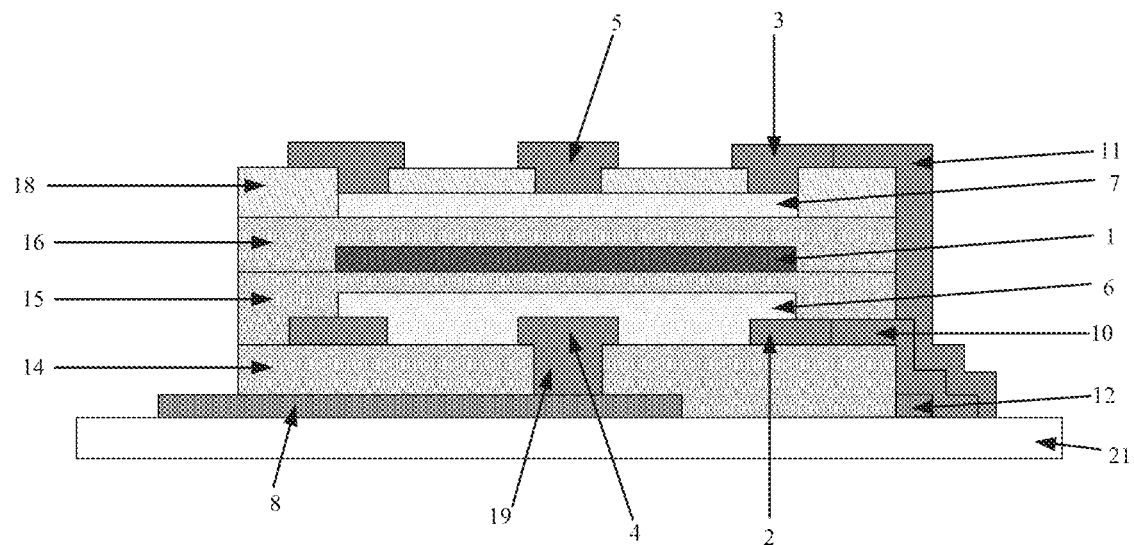

Referring to FIGS. 7h and 8h, at Step S208, a second source-drain material layer is formed at a side of the intermediate insulation layer 18 facing away from the base substrate 21, and then the second source-drain material layer is processed by a patterning process to obtain the patterns of the second source 5, the second drain 3 and the fourth conductive pattern 11. The second drain 3 has a ring-like shape and surrounds the second source 5. The second source 5 is connected to the second active layer 7 through the third via in the interlayer insulation layer 18, and the second drain 3 is connected to the second active layer 7 through the fourth via in the interlayer insulation 18. The fourth conductive pattern 11 is connected with the second drain 3 and is lapped over the third conductive pattern 10.

According to an embodiment of the present disclosure, the orthographic projections of the first drain 2 and the second drain 3 on the base substrate 21 may be overlapped completely, and the orthographic projections of the first source 4 and the second source 5 on the base substrate 21 may be overlapped completely, which can facilitate miniaturization of the thin film transistor.

At Step S209, a second insulation layer is formed at a side of of the second source and the second drain facing away from the base substrate, and a second via is formed in the second insulation layer.

Figure 7I:
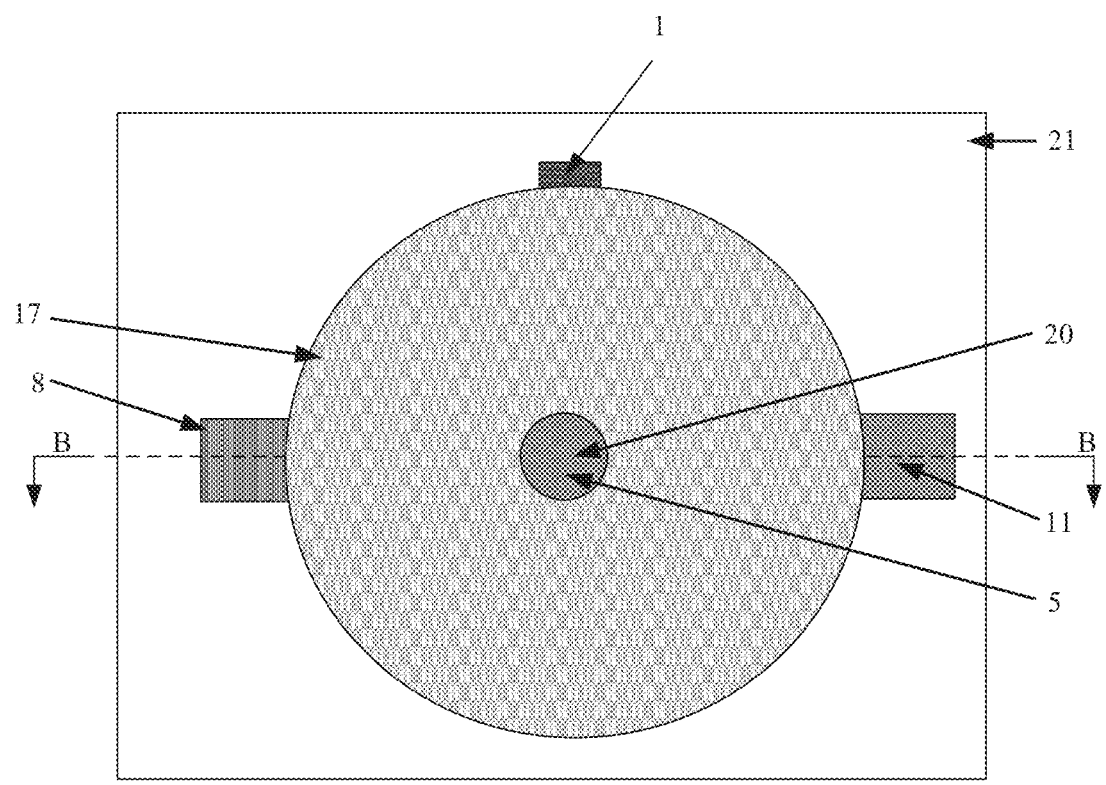
Figure 8I:
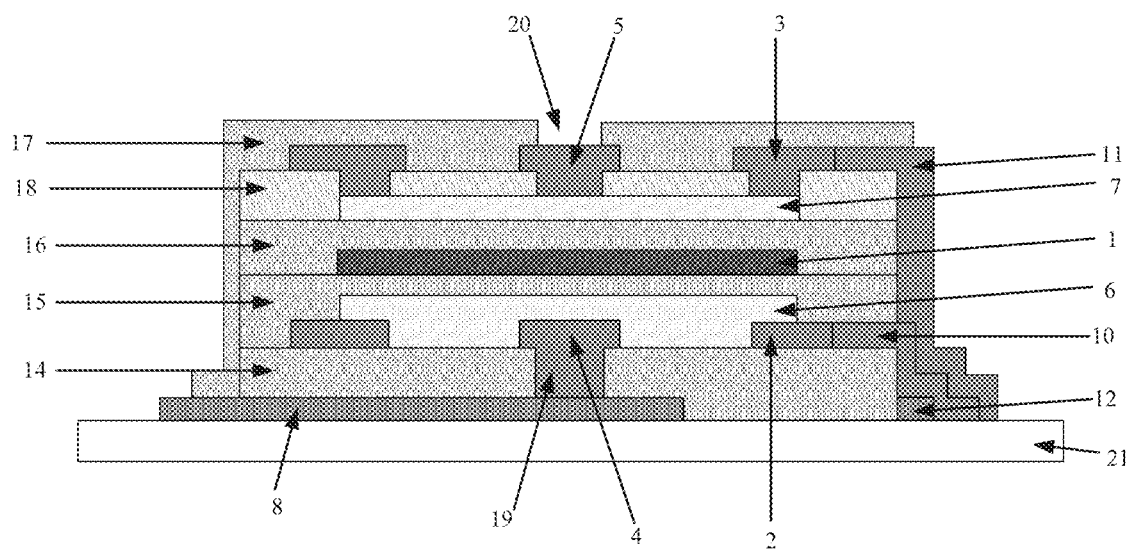

Referring to FIGS. 7i and 8i, at Step S209, a second insulation material layer is formed at a side of the first conductive pattern 8 facing away from the base substrate 21, and then the second insulation material layer is processed by a patterning process to obtain the pattern of the second insulation layer 17. The second via 20 is formed in the second insulation layer 17 to expose the second source 5.

At Step S210, a second conductive pattern and a sixth conductive pattern are formed at a side of the second insulation layer facing away from the base substrate.

Figure 7J:
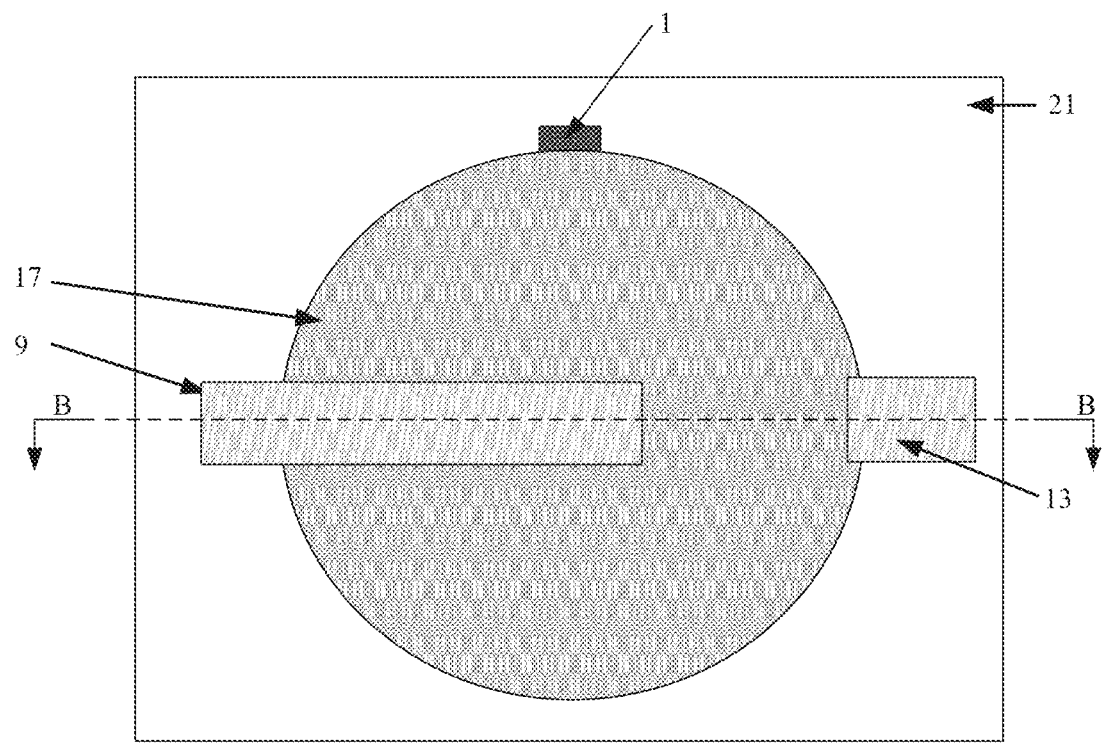
Figure 8J:
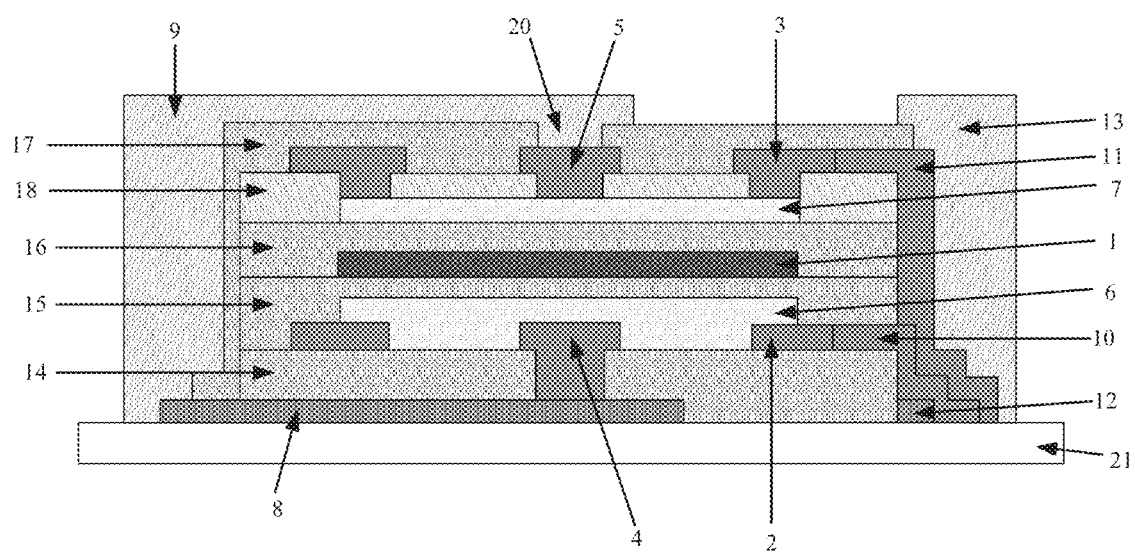

Referring to FIGS. 7j and 8j, at Step S210, a second conductive material layer is formed at a side of the second insulation layer 17 facing away from the base substrate 21, and then the second conductive material layer is processed by a patterning process to obtain the second conductive pattern 9 and the sixth conductive pattern 13. The second conductive pattern 9 is filled into the second via 20 in the second insulation layer 17 and is connected to the second source 5. The second conductive pattern 9 extends beyond a region surrounded by the second drain 3. The sixth conductive pattern 13 is lapped over the fourth conductive pattern 11.

The thin film transistor as shown in FIGS. 1 and 2 may be fabricated by the above Step S201 to Step 210

An embodiment of the present disclosure further provides an array substrate which includes the thin film transistor according to the present disclosure.

It will be appreciated that the above implementations are only exemplary implementations for illustrating the principle of the invention, and the present disclosure is not limited thereto. An ordinary person skilled in the art may make various modifications and improvements without departing from the spirit and essence of the present disclosure. These modifications and improvements should be considered as the protective scope of the present disclosure.

What is claimed is:

1. A thin film transistor, comprising a gate, a first active layer, a second active layer, a first source, a first drain, a second source and a second drain which are provided above a base substrate, wherein the first active layer is located at a side of the gate facing the base substrate;

the second active layer is located at a side of the gate facing away from the first active layer;

the first source and the first drain are located at a side of the first active layer facing away from the gate and are connected with the first active layer;

the second source and the second drain are located at a side of the second active layer facing away from the gate and are connected with the second active layer;

each of the first drain and the second drain has a ring-like shape, the first drain surrounds the first source, and the second drain surrounds the second source; and the first source is electrically connected with the second source, and the first drain is electrically connected with the second drain, the thin film transistor further comprising a first conductive pattern, a second conductive pattern, a first insulation layer and a second insulation layer, wherein the first conductive pattern is located at a side of the first source facing away from the first active layer, and extends beyond a region surrounded by the first drain;

the first insulation layer is formed between the first conductive pattern and the first active layer, the first insulation layer is provided with a first via therein, and the first source is connected to the first conductive pattern through the first via;

the second conductive pattern is located at a side of the second source facing away from the second active layer, and extends beyond a region surrounded by the second drain;

the second insulation layer is formed between the second conductive pattern and the second active layer, the second insulation layer is provided with a second via therein, and the second source is connected to the second conductive pattern through the second via; and a portion of the first conductive pattern located outside of the region surrounded by the first drain is connected with a portion of the second conductive pattern located outside of the region surrounded by the second drain.

2. The thin film transistor of claim 1, further comprising a third conductive pattern and a fourth conductive pattern, wherein the third conductive pattern is connected with the first drain, the fourth conductive pattern is connected with the second drain, and the third conductive pattern is connected with the fourth conductive pattern.

3. The thin film transistor of claim 2, further comprising a fifth conductive pattern, wherein the fifth conductive pattern is provided in a same layer as the first conductive pattern, and the third conductive pattern is lapped over the fifth conductive pattern.

4. The thin film transistor of claim 2, further comprising a sixth conductive pattern, wherein the sixth conductive pattern is provided in a same layer as the second conductive pattern, and the sixth conductive pattern is lapped over the fourth conductive pattern.

5. An array substrate, comprising the thin film transistor of claim 1.

6. A thin film transistor comprising a gate, a first active layer, a second active layer, a first source, a first drain, a second source and a second drain which are provided above a base substrate, wherein
the first active layer is located at a side of the gate facing the base substrate;
the second active layer is located at a side of the gate facing away from the first active layer;
the first source and the first drain are located at a side of the first active layer facing away from the gate and are connected with the first active layer;
the second source and the second drain are located at a side of the second active layer facing away from the gate and are connected with the second active layer;
each of the first drain and the second drain has a ring-like shape, the first drain surrounds the first source, and the second drain surrounds the second source; and
the first source is electrically connected with the second source, and the first drain is electrically connected with the second drain,
wherein the first drain and the second drain each have a circular ring shape, and the first source and the second source each have a circular shape.

7. An array substrate, comprising the thin film transistor of claim 6.

8. A method of fabricating a thin film transistor, comprising steps of:
forming a first source and a first drain above a base substrate such that the first drain has a ring-like shape, and the first drain surrounds the first source;
forming a first active layer at a side of the first source and the first drain facing away from the base substrate such that the first source and the first drain are connected with the first active layer;
forming a gate at a side of the first active layer facing away from the base substrate;
forming a second active layer at a side of the gate facing away from the base substrate; and
forming a second source and a second drain at a side of the second active layer facing away from the base substrate such that the second drain has a ring-like shape, the second drain surrounds the second source, and the second source and the second drain are connected with the second active layer,
wherein the second source is electrically connected with the first source, and the second drain is electrically connected with the first drain, and
wherein, prior to the step of forming the first source and the first drain above the base substrate, the method further comprises:
forming a first conductive pattern on the base substrate such that the first conductive pattern extends beyond a region surrounded by the first drain which will be formed later;
forming a first insulation layer at a side of the first conductive pattern facing away from the base substrate, and forming a first via in the first insulation layer such that the first source which will be formed later is connected with the first conductive pattern through the first via, and
wherein, after the step of forming the second source and the second drain at the side of the second active layer facing away from the base substrate, the method further comprises:
forming a second insulation layer at a side of the second source and the second drain facing away from the base substrate, and forming a second via in the second insulation layer;
forming a second conductive pattern at a side of the second insulation layer facing away from the base substrate such that the second conductive pattern is connected with the second source through the second via, and the second conductive pattern extends beyond a region surrounded by the second drain,
wherein, a portion of the second conductive pattern located outside of the region surrounded by the second drain is connected with a portion of the first conductive pattern located outside of the region surrounded by the first drain, and
wherein, a third conductive pattern connected with the first drain is formed at a same time when the first source and the first drain are formed above the base substrate,
wherein, a fourth conductive pattern connected with the second drain is formed at a same time when the second source and the second drain are formed at the side of the second active layer facing away from the base substrate, and
wherein, the fourth conductive pattern is connected with the third conductive pattern.

9. The method of fabricating a thin film transistor of claim 8, wherein, a fifth conductive pattern is further formed so as to be provided in a same layer as the first conductive pattern, at a same time when the first conductive pattern is formed on the base substrate, and the third conductive pattern which is formed later is lapped over the fifth conductive pattern, and
wherein, a sixth conductive pattern is further formed so as to be provided in a same layer as the second conductive pattern, at a same time when the second conductive pattern is formed at the side of the second insulation layer facing away from the base substrate, and the sixth conductive pattern is lapped over the fourth conductive pattern.

10. A method of fabricating the thin film transistor of claim 6, comprising steps of:
forming the first source and the first drain above the base substrate such that the first drain has the ring-like shape, and the first drain surrounds the first source;
forming the first active layer at the side of the first source and the first drain facing away from the base substrate such that the first source and the first drain are connected with the first active layer;
forming the gate at the side of the first active layer facing away from the base substrate;
forming the second active layer at the side of the gate facing away from the base substrate; and
forming the second source and the second drain at the side of the second active layer facing away from the base substrate such that the second drain has the ring-like shape, the second drain surrounds the second source, and the second source and the second drain are connected with the second active layer,
wherein the second source is electrically connected with the first source, and the second drain is electrically connected with the first drain, and
wherein the first drain and the second drain each have the circular ring shape, and the first source and the second source each have the circular shape.

* * * * *